United States Patent [19]
Tanaka et al.

[11] Patent Number: 5,258,628
[45] Date of Patent: Nov. 2, 1993

[54] LINEARIZING EMITTED LIGHT INTENSITY FROM A LIGHT-EMITTING DEVICE

[75] Inventors: Yukio Tanaka, Yokohama; Ryoichi Tohmon, Tokyo, both of Japan

[73] Assignee: Eastman Kodak Company, Rochester, N.Y.

[21] Appl. No.: 923,644

[22] Filed: Aug. 3, 1992

[30] Foreign Application Priority Data

Feb. 27, 1992 [JP] Japan .................................. 4-041763

[51] Int. Cl.$^5$ ............................................ H01L 33/00
[52] U.S. Cl. ..................................... 257/79; 257/101; 257/102; 257/103; 257/657
[58] Field of Search .................. 257/102, 103, 86, 87, 257/101, 631, 657, 927, 495, 79

[56] References Cited

U.S. PATENT DOCUMENTS

| | | | |
|---|---|---|---|
| 3,921,199 | 11/1975 | Yuan et al. | 257/495 |
| 4,942,439 | 7/1990 | Schairer | 257/102 |
| 5,107,311 | 4/1992 | Tsukamoto et al. | 257/101 |

FOREIGN PATENT DOCUMENTS

| | | | |
|---|---|---|---|
| 58-44779 | 3/1983 | Japan | 257/101 |
| 58-151068 | 9/1983 | Japan | 257/495 |
| 61-179581 | 8/1986 | Japan | 257/86 |
| 62-250679 | 10/1987 | Japan | 257/101 |

*Primary Examiner*—William Mintel
*Attorney, Agent, or Firm*—Raymond L. Owens

[57] ABSTRACT

A light-emitting device in which impurity concentrations are varied to cause the increase in the intensity of the emitted light to be linear with respect to the increase in current, thereby facilitating current-based control of the light intensity.

2 Claims, 5 Drawing Sheets

LINEARIZING EMITTED LIGHT INTENSITY FROM A LIGHT-EMITTING DEVICE

BACKGROUND OF THE INVENTION

1. Field of the Invention

The present invention relates to a light-emitting device, and more particularly to a surface emitting type light-emitting device.

2. Description of the Prior Art

Small, light, light-emitting devices are extensively used in various fields. In recent years, light-emitting devices are also used in optical printers that use a beam of light to record information, in image and bar-code reading systems that utilize the intensity of a reflected beam of light, and in optical communications devices that utilize optical signals.

FIG. 6 is a cross-sectional view of the structure of a conventional light-emitting device, and FIG. 7 is a plan view of a conventional light-emitting device. With reference to the drawings, GaAsP containing tellurium is used to form an n-type semiconductor 2. Zinc is diffused into the n-type semiconductor 2 to form p-GaAsP semiconductor (hereinafter referred to as p-type semiconductor 1). A positive electrode (p-electrode) 3 is then provided on the upper surface of the p-type semiconductor 1 and a negative electrode (n-electrode) 4 on the lower surface of the n-type semiconductor 2. When a forwardly biased voltage is applied to the junction between the p-type semiconductor 1 and the n-type semiconductor 2, the electrical energy is converted into optical energy by the recombination of the carriers injected into the junction, producing an emission of light.

However, when a forwardly biased voltage is applied to a p-n junction, the relationship between the current flowing in the light-emitting device and the optical output is as shown by the solid line in the graph of FIG. 8. Namely, while the optical output increases when the current is increased, in low current regions this increase is nonlinear and depends strongly on the current. That is, when a voltage V is applied to the p-n junction, the device current is divided into a component that is proportional to $\exp(eV/kT)$ (hereinafter referred to as the type A current component) and a component that is proportional to $\exp(eV/2kT)$ (hereinafter referred to as the type B current component). In this case, the intensity of light emitted by the light-emitting device is proportional to the type A current component current.

Since in a high current region the type A current component accounts for the major portion of the total current, the amount of light emitted by the light-emitting device is proportional to the type A current component and the increase in the light amount is linear with respect to the increase in the device current.

That is, when there is a large current there is a linear relationship between optical output and current that does not depend on the current, but when the current is small the type B current component occupies a relatively large proportion and the relationship between the A and type B current components depends on the voltage, so the increase in light intensity relative to the increase in current becomes nonlinear. The type B current component current consists mainly of electron and hole recombinations which occur in the depletion layer in the vicinity of the p-n junction exposed on the device surface.

In a light-emitting device, an increase in light intensity that is nonlinear with respect to the increase in current presents problems when it comes to using the current to control the light intensity, making it difficult to control the light intensity when such light-emitting devices are used as light sources of optical printers, image readers and optical communications devices.

SUMMARY OF THE INVENTION

An object of the present invention is therefore to provide a light-emitting device in which the increase in light intensity is linear with respect to the increase in current, thereby facilitating control of the light intensity when the light-emitting device is used in various devices.

Another object of the present invention is to provide a light-emitting device, comprising:

(a) a p-n junction formed between a p-type semiconductor and an n-type semiconductor which provides a depletion region and wherein an electrode over the top surface of the device applies a forwardly-biased voltage across the depletion region to provide light emission, such forwardly applied voltage produces type A and type B current components; and (b) an impurity concentration region provided in the p-type semiconductor or n-type semiconductor at a position of the p-n junction that is adjacent to the top surface and selected to cause a decrease in the type B current component.

The object is also attained in a light-emitting device thus constituted in which the impurity concentration is two or more times higher than that of the portion that is not exposed on the surface.

The object is also attained by a light-emitting device comprising a p-n junction formed between a p-type semiconductor and an n-type semiconductor in which light emission is produced by applying a forwardly-biased voltage across electrodes, wherein the impurity concentration in the p-type and n-type semiconductor at a position of the p-n junction that is adjacent to the top surfaces is higher than that of the portion that is not exposed on the surface. The object is further attained by a light-emitting device thus constituted in which the impurity concentration in the p-type and n-type semiconductor at a p-n junction depletion layer portion that is exposed on the surface is two or more times higher than that of the portion that is not exposed on the surface.

In this invention, by forming a high-concentration n-type semiconductor (p-type semiconductor) on the n-type semiconductor (p-type semiconductor), covering the depletion layer in the vicinity of the p-n junction exposed on the surface of the device and reducing the width of the depletion layer in the vicinity of the p-n junction exposed on the surface, electron and hole recombinations occurring in the depletion region in the vicinity of the p-n junction are suppressed. By thus suppressing the generation of current components that do not contribute to light emission, the increase in light intensity that takes place when the device current increases becomes linear.

Further features of the invention, its nature and various advantages will become more apparent from the accompanying drawings and following detailed description of the invention.

DESCRIPTION OF THE PREFERRED EMBODIMENT

Figure 1:
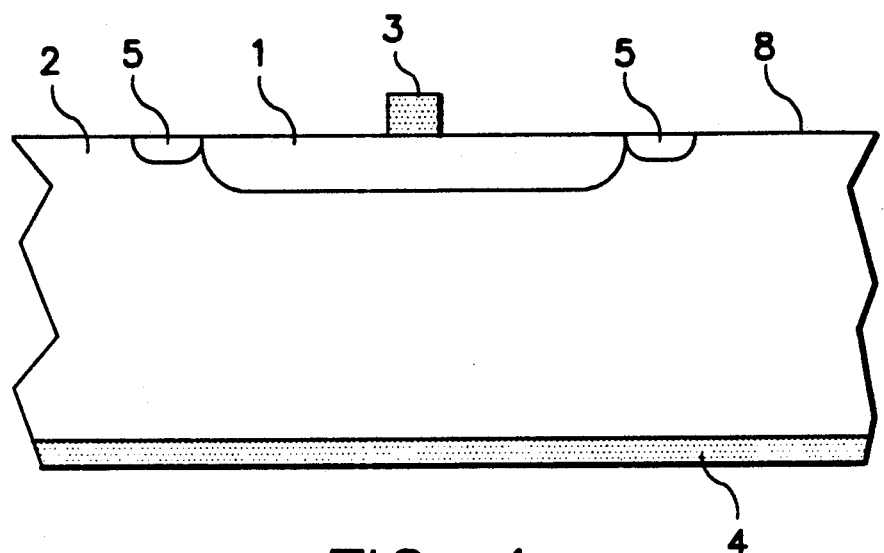
FIG. 1 is a cross-sectional view of a light-emitting device according to a first embodiment of the present invention.
Figure 2:
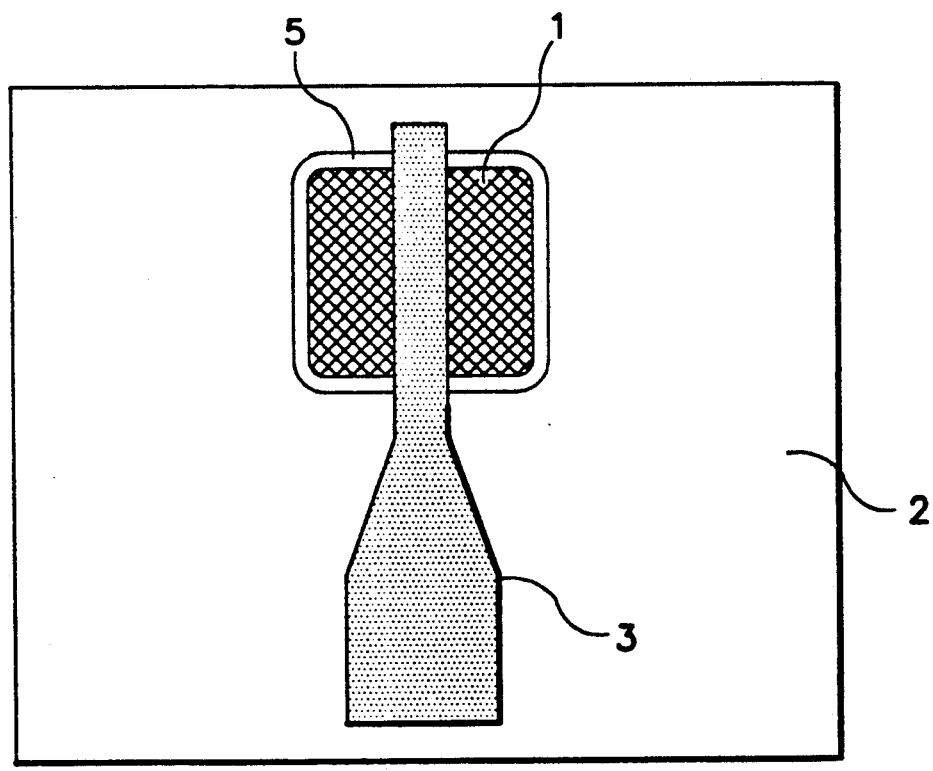
FIG. 2 is a plan view of a light-emitting device according to this invention.

FIGS. 1 and 2 are a cross-sectional view and a plan view, respectively, of a light-emitting device according to the first embodiment of this invention. With reference to the drawings, GaAsP containing tellurium is used to form an n-type semiconductor 2, into which zinc is diffused to form a p-GaAsP semiconductor (hereinafter referred to as p-type semiconductor 1). A positive electrode (p-electrode) 3 is then formed on the upper surface of the p-type semiconductor 1 and a negative electrode (n-electrode) 4 on the lower surface of the n-type semiconductor 2. The p-n junction extends from the device top surface 8 into the body of the device. It will be understood to those skilled in the art that other protective layers may be provided on the device top surface 8.

At the position of the p-n junction (formed between the p-type semiconductor 1 and n-type semiconductor 2) that is adjacent to the device top surface, diffusion or ion implantation is used to form a high-concentration n-GaAsP region 5 having a concentration higher than that of the n-type semiconductor 2, and selected (position and concentration level) so as to affect the depletion layer in the vicinity of the p-n junction to cause a decrease in type B current.

The operation of the light-emitting device thus configured will now be described. When the voltage applied to the p-n junction formed by the p-type semiconductor 1 and n-type semiconductor 2 is V, the device current is divided into a component that is proportional to exp(eV/kT) (hereinafter referred to as the type A current component) and a component that is proportional to exp(eV/2kT) (hereinafter referred to as the type B current component). The intensity of light emitted by the light-emitting device is proportional to the type A current component current.

When the current is large, that is, when the voltage V is large, the type A current component accounts for the major portion of the total current. Therefore, as the amount of light emitted by the light-emitting device is proportional to the type A current component, the light amount will increase linearly with respect to the increase in the device current. This means that when voltage V is large, the relationship between current and optical output is constant.

However, under small current conditions, meaning when voltage V is small, it is the type B current component that accounts for a relatively large proportion of the current and the ratio between the type A and B current components therefore depends on the voltage, so the increase in light intensity resulting from an increase in the current becomes nonlinear. That is, in regions where voltage V is small the relationship between current and optical output becomes dependent on the current value. The type B current component current consists mainly of electron and hole recombinations which occur in the depletion region in the vicinity of the p-n junction exposed on the device surface.

As the depletion layer width is reciprocally proportional to the square root of the impurity concentration, it is known that increasing the impurity concentration decreases the width of the depletion layer. This means that it is possible to reduce the width of the depletion layer and decrease the generation of the type B current component by increasing the impurity concentration.

Figure 3:
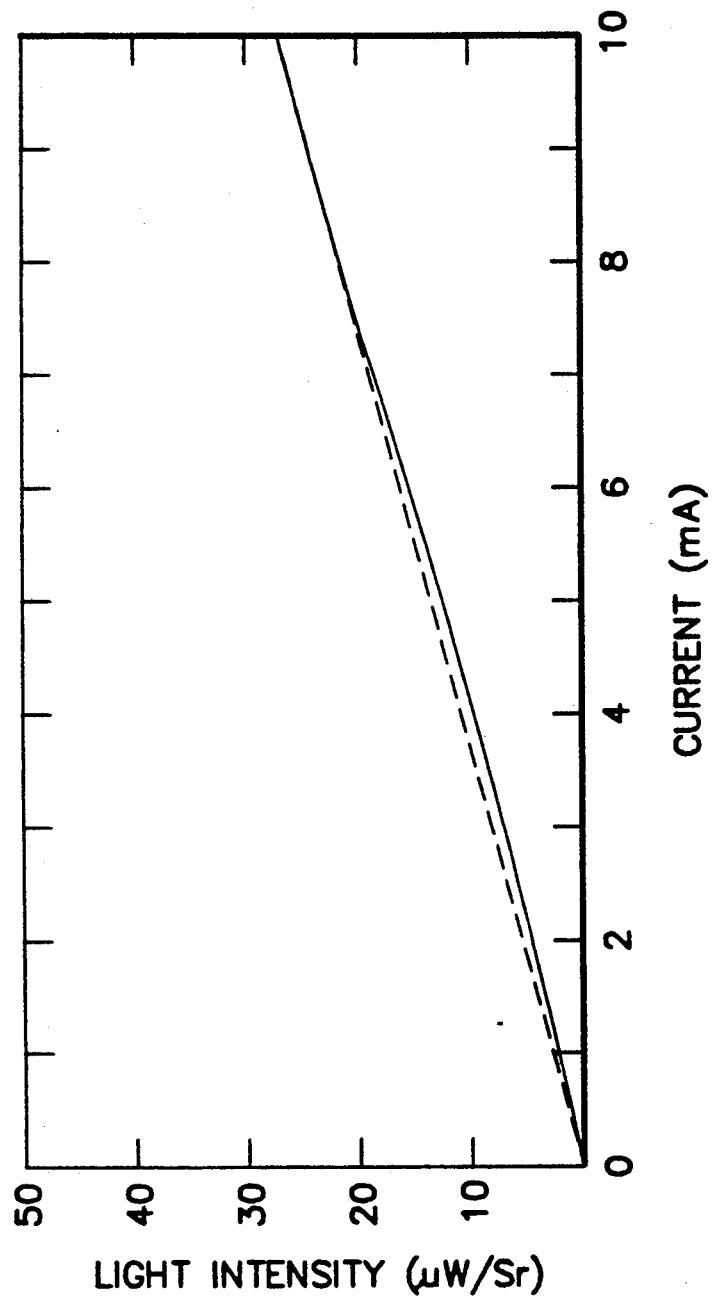
FIG. 3 is a graph showing the relationship between current and light intensity in the light-emitting device of the invention.

In accordance with this invention, as shown by the solid line in the graph of FIG. 3, even in low current regions a linear relationship between the increase in device current and the increase in light intensity is achieved by increasing the impurity concentration in the n-type semiconductor that covers the depletion layer in the vicinity of the p-n junction exposed on the surface, thereby making it possible to decrease the width of the depletion layer and decrease the type B current component.

Although the above embodiment has been described with reference to a light-emitting device in which the p-type semiconductor is formed on the n-type semiconductor, a light-emitting device with the same configuration may be fabricated in which it is the n-type semiconductor that is formed on the p-type semiconductor.

Figure 4:
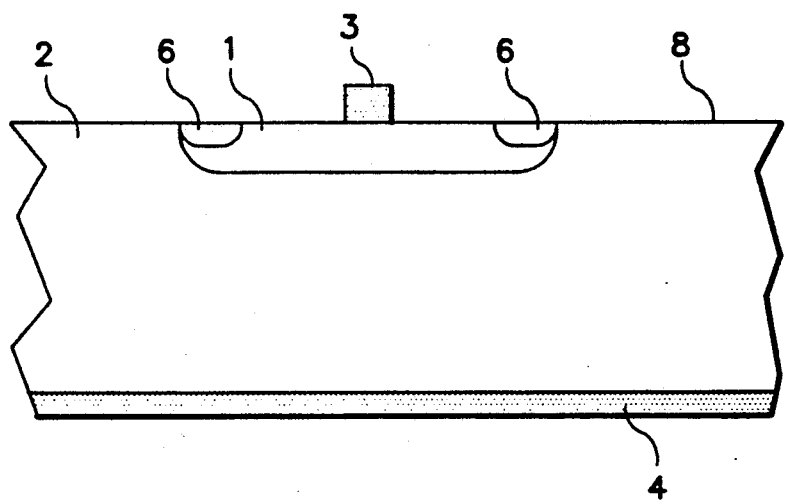
FIG. 4 is a cross-sectional view of a light-emitting device according to a second embodiment of the present invention.
Figure 5:
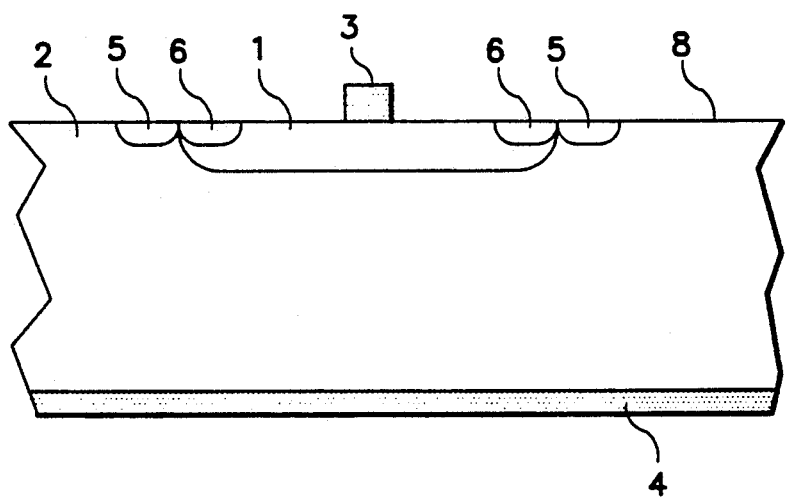
FIG. 5 is a cross-sectional view of a light-emitting device according to a third embodiment of the invention.
Figure 6:
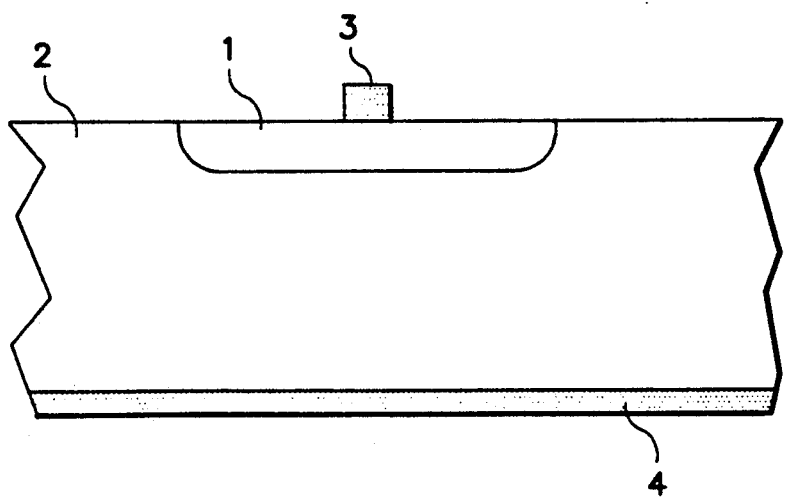
FIG. 6 is a cross-sectional view of a conventional light-emitting device.
Figure 7:
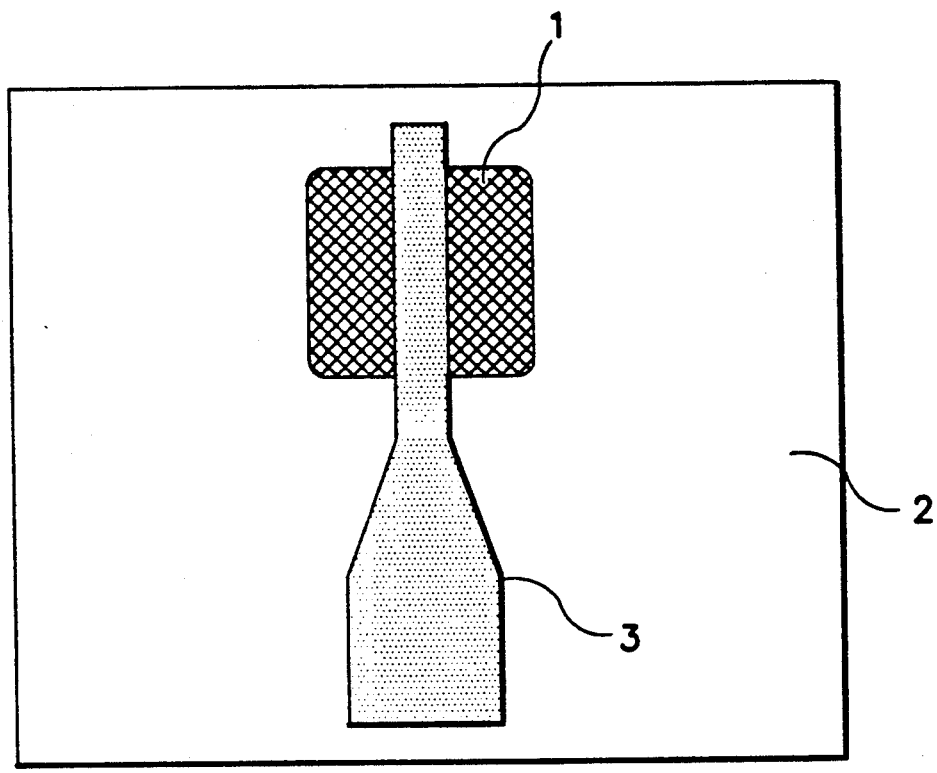
FIG. 7 is a plan view of the conventional light-emitting device of FIG. 6.
Figure 8:
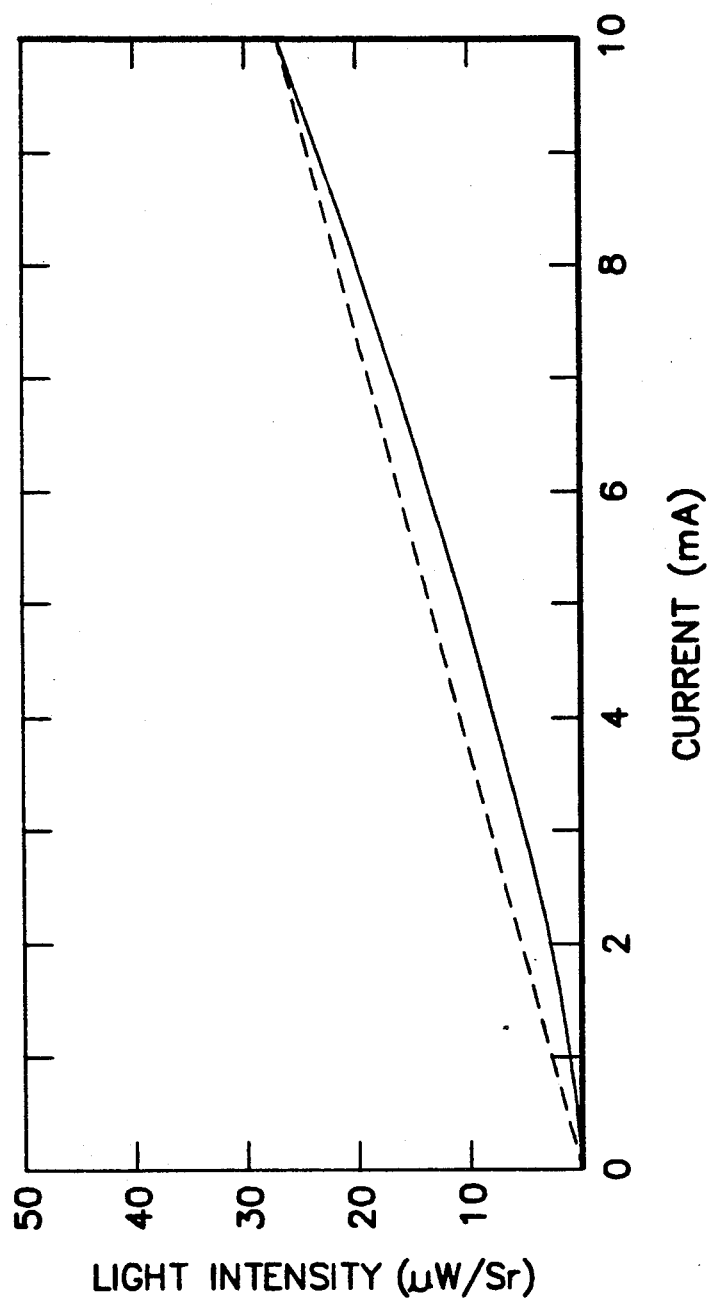
FIG. 8 is a graph showing the relationship between current and light intensity in the light-emitting device of FIGS. 6 and 7.

Similarly, although the above description has been made with reference to an arrangement in which high-concentration n-GaAsP semiconductor is formed on the n-GaAsP surface of the light-emitting device, the invention is not limited to that arrangement. The same effect may be realized by the arrangement according to the second embodiment of the invention, shown in FIG. 4, in which high-concentration p-GaAsP semiconductor region 6 is formed in the p-GaAsP semiconductor 1 at a position of the p-n junction adjacent to the device top surface 8. The effect may also be achieved with the third embodiment shown in FIG. 5, in which a first high-concentration n-GaAsP semiconductor region 5 is formed on a n-type semiconductor 2 at a position of the p-n junction adjacent to the top surface of the device while at the same time also forming a high-concentration p-GaAsP semiconductor 6 on the p-type semiconductor 1 on the device surface.

Again, while in the above description the n-type semiconductor is GaAsP that contains tellurium, GaAsP containing other elements such as tin, selenium, sulfur, germanium, and silicon may also be used. Similarly, while in the above description the p-type semiconductor is GaAsP that contains zinc, GaAsP containing other elements such as magnesium, manganese, cadmium and the like may also be used. Also, while in the above description GaAsP is used as the n and p semiconductors, it is possible to use other compound semiconductors such as GaAs, AlAsP, GaP, and InGaP, for example. Furthermore, while the p-type semiconductor has been described as being formed by means of impurity diffusion, other methods may be applied such as ion implantation, for example.

The invention has been described in detail with particular reference to certain preferred embodiments thereof, but it will be understood that variations and modifications can be effected within the spirit and scope of the invention.

What is claimed is:

1. A light-emitting device, comprising:
   (a) a p-n junction formed between a p-type semiconductor and an n-type semiconductor which provides a depletion region and wherein an electrode over the top surface of the device applies a forwardly-biased voltage across the depletion region to provide light emission, such forwardly applied voltage produces type A and type B current components, the type A current component being proportional to $\exp(eV/kT)$ and the type B current component being proportional to $\exp(eV/2kT)$ wherein V is the device voltage applied to the p-n junction and T is the device temperature; and
   (b) a first n-type impurity concentration region and a second p-type impurity concentration region respectively formed in the n- and p-type semiconductors and formed at a position of the p-n junction adjacent to the top surface and selected to cause a decrease in the type B current component.

2. The light-emitting device according to claim 1 in which the first and second impurity concentration regions are each two or more times higher than that of their corresponding semiconductors.

* * * * *